United States Patent
Stark et al.

(10) Patent No.: US 6,560,118 B2
(45) Date of Patent: *May 6, 2003

(54) INJECTION MOLD GATE CONCEALMENT BY INTEGRATING SURFACE RECESS AND COSMETIC LABEL ATTACHMENT

(75) Inventors: Michael Stark, Tempe, AZ (US); Michael Rutigliano, Chandler, AZ (US); Amol Kirtikar, Chandler, AZ (US); Peter A. Davison, Sumner, WA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/024,802

(22) Filed: Feb. 17, 1998

(65) Prior Publication Data

US 2002/0001182 A1 Jan. 3, 2002

(51) Int. Cl.[7] .............................. H05K 5/00; H05K 5/04; H05K 5/06
(52) U.S. Cl. ...................... 361/752; 361/728; 361/736; 361/737
(58) Field of Search ................................. 361/728, 752, 361/737, 736; 156/DIG. 1, 293; 40/638, 594, 618; 283/98; 226/118.4, 91 A; 242/55.19

(56) References Cited

U.S. PATENT DOCUMENTS

| | | | | |
|---|---|---|---|---|
| 2,904,912 A | * | 9/1959 | Barrett | 283/98 |
| 3,181,613 A | * | 5/1965 | Rojc et al. | 126/91 A |
| 3,403,868 A | * | 10/1968 | Lear | 226/118.4 |
| 3,482,792 A | * | 12/1969 | Auld | 226/118.4 |
| RE27,584 E | * | 2/1973 | Cousino | 242/55.19 |
| 4,765,656 A | * | 8/1988 | Becker et al. | 283/70 |
| 5,209,424 A | * | 5/1993 | Fischer et al. | 242/197 |
| 5,326,654 A | * | 7/1994 | Will et al. | 429/167 |
| 5,329,654 A | * | 7/1994 | Will et al. | 429/167 |
| 5,667,906 A | * | 9/1997 | Huang | 429/90 |
| 5,752,857 A | * | 5/1998 | Knights | 439/638 |
| 5,838,542 A | * | 11/1998 | Nelson et al. | 361/704 |
| 5,877,941 A | * | 3/1999 | Ryu | 361/737 |
| 5,970,878 A | * | 10/1999 | Gardner | 102/449 |
| 5,989,216 A | * | 11/1999 | Johnson et al. | 604/93 |
| 6,053,606 A | * | 4/2000 | Yamaguchi et al. | 347/86 |

* cited by examiner

Primary Examiner—Albert W. Paladini
Assistant Examiner—Tuan Dinh
(74) Attorney, Agent, or Firm—Blakely, Sokoloff, Taylor & Zafman LLP

(57) ABSTRACT

An emblem that is located within a recess of a cover. The cover may be part of a cartridge which also contains a number of integrated circuit packages that are mounted to a printed circuit board. The emblem is typically attached to the cover by an adhesive. The recess reduces the likelihood of the emblem being removed from the cover. The emblem preferably contains a hologram which can identify a type of cartridge produced by a manufacturer.

3 Claims, 1 Drawing Sheet

INJECTION MOLD GATE CONCEALMENT BY INTEGRATING SURFACE RECESS AND COSMETIC LABEL ATTACHMENT

BACKGROUND OF THE INVENTION

1. Field of the Invention

The present invention relates to a cover of an electronic cartridge.

2. Background Information

Integrated circuits are typically assembled into a package that is soldered to a printed circuit board. Historically, manufacturers of integrated circuits such as microprocessors have sold the integrated circuit packages to entities that mount the packages to a circuit board. The circuit board is then assembled into a larger system such as a personal computer.

The integrated circuit packages are typically soldered to the printed circuit board. The solder process requires capital equipment such as wave solder tables, etc. Additionally, the solder must be reflowed to upgrade or replace the integrated circuit package that is mounted to the board. Reflowing the solder can degrade the integrity of the printed circuit board. It is desirable to incorporate the integrated circuit packages into a cartridge that can be plugged into a motherboard so that the customer of the integrated circuit does not have to solder the package.

It would be desirable if such a cartridge could be plugged into the circuit board by a consumer, so that the end user can upgrade a system such as a personal computer. Such a cartridge would preferably have a cover to prevent contact between the end user and the integrated circuit packages. The cover may also improve the appearance of the product.

It may be desirable or provide an emblem on the cartridge to both identify the manufacturer and the type of product. The emblem should be attached to the cartridge in a manner that would make it difficult to remove from the product.

SUMMARY OF THE INVENTION

One embodiment of the present invention is a cover which has a recess and an emblem that is attached to the recess of the cover. The cover can be incorporated into an electronic cartridge.

DETAILED DESCRIPTION OF THE INVENTION

One embodiment of the present invention is an emblem that is located within a recess of a cover. The cover may be part of an electronic cartridge which also contains a number of integrated circuit packages that are mounted to a printed circuit board. The emblem is typically attached to the cover by an adhesive. The recess reduces the likelihood of the emblem being removed from the cover. The emblem preferably contains a hologram which can identify a type of cartridge produced by a manufacturer.

Figure 1:
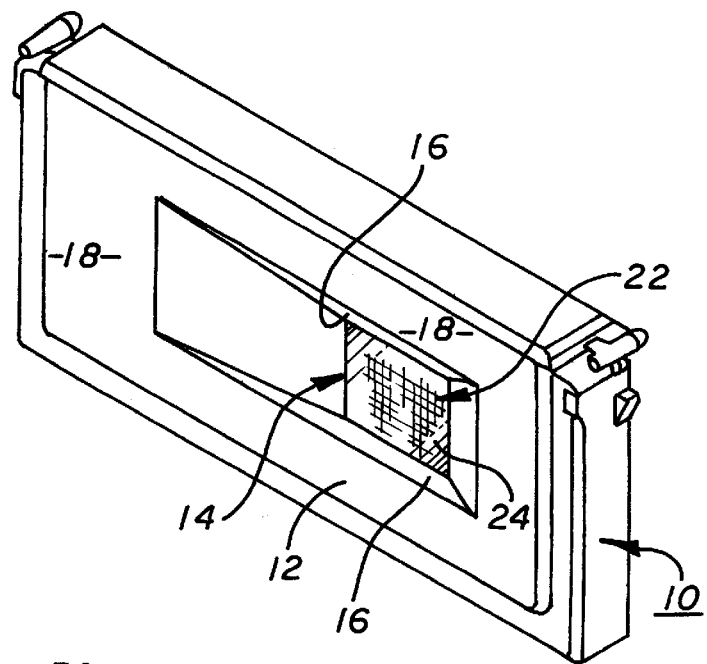
FIG. 1 is a perspective view of an embodiment of an electronic cartridge of the present invention.
Figure 2:
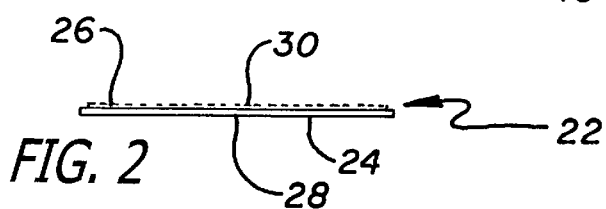
FIG. 2 is a top view showing an adhesive that is applied to an emblem.
Figure 3:
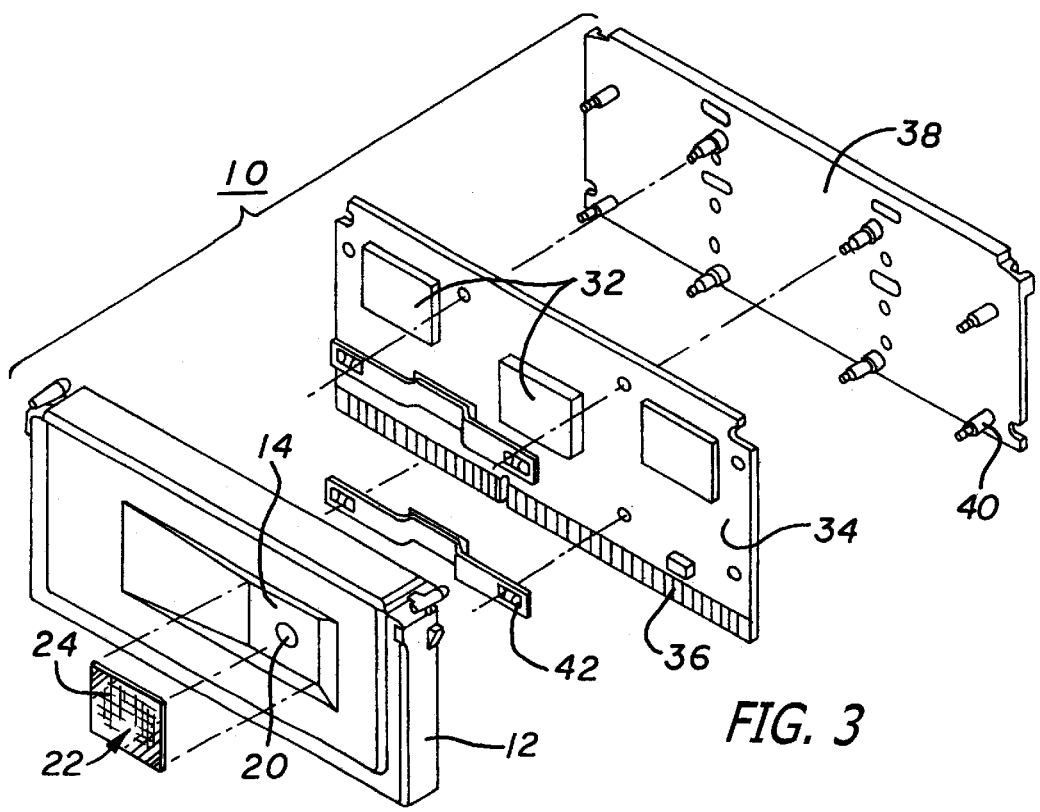
FIG. 3 is an exploded view of the electronic cartridge.

Referring to the drawings more particularly by reference numbers, FIGS. 1–3 show an embodiment of an electronic cartridge 10 of the present invention. The cartridge 10 includes a cover 12. The cover 12 has a recess 14. The cover 12 may further have tapered surfaces 16 which extend from the recess 14 to an outer planar surface 18. The cover 12 is typically constructed from an injection molded plastic material. The mold process may leave a gate vestige 20 in the recess 14.

An emblem 22 may be attached to the cover 12. The emblem 22 is preferably located within the recess 14. Locating the emblem 22 within the recess 14 reduces the likelihood that the emblem 22 will be removed or delaminated from the cover 12. Additionally, the emblem 22 conceals the gate vestige 20, thereby improving the appearance of the cartridge 10. The recess 14 also provides a target for the attachment of the emblem 22 during the manufacturing process of the cartridge 10.

The emblem 22 may include a hologram 24. The hologram 24 may identify the manufacturer of the cartridge 10. Likewise, the hologram 24 may identify the type of product. For example, if the cartridge contains a microprocessor, one type of holographic pattern may identify a product that operates at a certain frequency such as 200 megahertz, while another type of holographic pattern identifies a different product that operates at a different frequency such as 233 megahertz. The holographic emblem 22 may allow product identification by visual inspection.

As shown in FIG. 2, the emblem 22 may have a back surface 26 and a front surface 28. The hologram 24 may be located on the front surface 28. An adhesive 30 may be attached to the back surface 26 of the emblem 22. The adhesive 30 may attach the emblem 22 to the cover 12.

Referring to FIG. 3, the electronic cartridge 10 may include one or more integrated circuit packages 32 that are mounted to a substrate 34. The substrate 34 may be a printed circuit board. One edge of the printed circuit board 34 may have a plurality of conductive pads 36. The conductive pads 36 are electrically coupled to the integrated circuits (not shown) within the packages 32. The conductive pads 36 can be inserted into an electrical connector (not shown) that is mounted to a motherboard (not shown). The cartridge can thus be a cartridge that plugs into a motherboard of a computer system.

The cartridge 10 may include a thermal plate 38 that is attached to the cover 12 and the substrate 34 by pins 40 and spring clips 42. The thermal plate 38 may be thermally coupled to the integrated circuit packages 32. The plate 38 and cover 12 enclose the integrated circuit packages 32.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A cover for an electronic cartridge, comprising:

an outer planar surface having a plurality of sides, said plurality of sides defining a periphery of said cover;

a recess located within said periphery of said cover and having a plurality of tapered surfaces extending from said recess to said outer planar surface; and an emblem attached to said cover and located within said recess.

2. An electronic cartridge, comprising:

a substrate;

an integrated circuit attached to said substrate;

a cover attached to said substrate, comprising:
- an outer planar surface having a plurality of sides, said plurality of sides defining a periphery of said cover;
- a recess located within said periphery of said cover and having a plurality of tapered surfaces extending from said recess to said outer planar surface; and
- an emblem attached to said cover and located within said recess.

3. A method for securing an emblem to a cover of an electronic cartridge, comprising:

providing a recess located within a periphery of an outer planar surface of said cover, said recess having a plurality of tapered surfaces extending from said recess to said outer planar surface; and attaching said emblem to said cover within said recess.

* * * * *